United States Patent
Chou

(10) Patent No.: US 6,639,483 B2
(45) Date of Patent: Oct. 28, 2003

(54) PULSE WIDTH MODULATION INTEGRATED CIRCUIT CHIP

(75) Inventor: Chin-Kou Chou, Taoyuan Shien (TW)

(73) Assignee: Delta Electronics, Inc., Taoyuan Shien (TW)

( * ) Notice: Subject to any disclaimer, the term of this patent is extended or adjusted under 35 U.S.C. 154(b) by 0 days.

(21) Appl. No.: 10/139,570

(22) Filed: May 6, 2002

(65) Prior Publication Data

US 2003/0034853 A1 Feb. 20, 2003

(30) Foreign Application Priority Data

Aug. 16, 2001 (TW) ........................................ 90120149 A

(51) Int. Cl.[7] ................................................. H03K 7/08
(52) U.S. Cl. ........................................ 332/109; 363/15
(58) Field of Search .................................. 332/109, 110, 332/112; 323/207; 363/15, 41, 21.05, 97

(56) References Cited

U.S. PATENT DOCUMENTS 5,742,151 A * 4/1998 Hwang ........................ 323/222
5,999,421 A * 12/1999 Liu ........................... 363/21.15
6,208,538 B1 * 3/2001 Halamik et al. .............. 363/41

* cited by examiner

Primary Examiner—Timothy P. Callahan
Assistant Examiner—Linh Nguyen
(74) Attorney, Agent, or Firm—Volpe and Koenig, P.C.

(57) ABSTRACT

A pulse width modulation integrated circuit (PWM IC) chip available as an 8-pin DIP or a 14-pin SOP package is characterized by simplified circuit complexity, high package density, more voltage regulation functions and more pin functions. The PWM IC of the present invention uses several internal control circuit to create and define the pin functions thereof and is capable of controlling the switch of the internal power control circuit therein, modulating the operation frequency of the PWM IC, accomplishing the voltage feedback operation of the power supply, sensing the external current and increasing the pulse width of the output pulse signal tardily as the PWM IC starts up. More specifically, because the PWM IC of the present invention employs internal current sources to create and define the pin functions thereof, the PWM IC can be equipped with less pin numbers, simpler circuit complexity and higher package density.

3 Claims, 6 Drawing Sheets

PULSE WIDTH MODULATION INTEGRATED CIRCUIT CHIP

FIELD OF THE INVENTION

The present invention is related to a pulse width modulation integrated circuit (IC) chip, and more particularly to a pulse width modulation integrated circuit chip available as an 8-pin DIP (dual-in-line package) or a 14-pin SOP (small-outline package) package.

BACKGROUND OF THE INVENTION

In the technical field associated with switching mode power supply (SMPS), the pulse width modulation integrated circuit (PWM IC) is applied to drive a switching transistor to switch its on/off states, so as to generate an input DC voltage by rectifying and filtering the input AC voltage of the commercially available power source. The transformer of a switching mode power supply is coupled in series with a switching transistor to convert the input DC voltage into AC voltage, thereby conveying the energy of the transformer to its secondary side and providing an output DC voltage for a load by performing rectification/filtering operations.

It can be understood by way of the above statements that the PWM IC is employed as the major control circuit in a switching mode power supply and a common voltage regulator. However, in order to allow the PWM IC to be more adapted for use in a switching mode power supply and heighten its performance, there is a need to develop a PWM IC with simpler circuit layout, less pin number, higher package density and lower cost.

It is highly desirable to address a novel circuit layout for a PWM IC with high package density and less pin number, which can provide complete voltage regulation function through the use of less pins, and is advantageous in terms of cost descent and power density promotion.

SUMMARY OF THE INVENTION

The foregoing objects can be fulfilled by a PWM IC chip presented as an 8-pin DIP (dual-in-line package) package or a 14-pin SOP (small outline package) package. The present invention provides a PWM IC chip including a plurality of internal control circuits, each of the internal control circuits respectively creates and defines a pin function. These internal control circuits can be used to sense the external linear voltage and compare the sensed external voltage with the internal reference voltage, and output a control signal in response to the comparison result to switch the states of a switch of the internal power control circuit in the PWM IC. In addition, the present invention uses an internal current source to implement the control function of these internal control circuits, for example, modulate the operation frequency of the PWM IC, accomplish the voltage feedback operation for the power supply, sense the external current value and control the PWM IC to increase the pulse width of the output pulse signal tardily when undergoing an power initialization. As a result, most of the pin functions of the PWM IC of the present invention is created and defined by internal current sources instead of external voltage sources, so that the complexity of circuit layout is greatly simplified.

Now the foregoing and other features and advantages of the present invention will be more clearly understood through the following descriptions with reference to the accompanying drawings, wherein:

DETAILED DESCRIPTION OF THE PREFERRED EMBODIMENT

Figure 1:
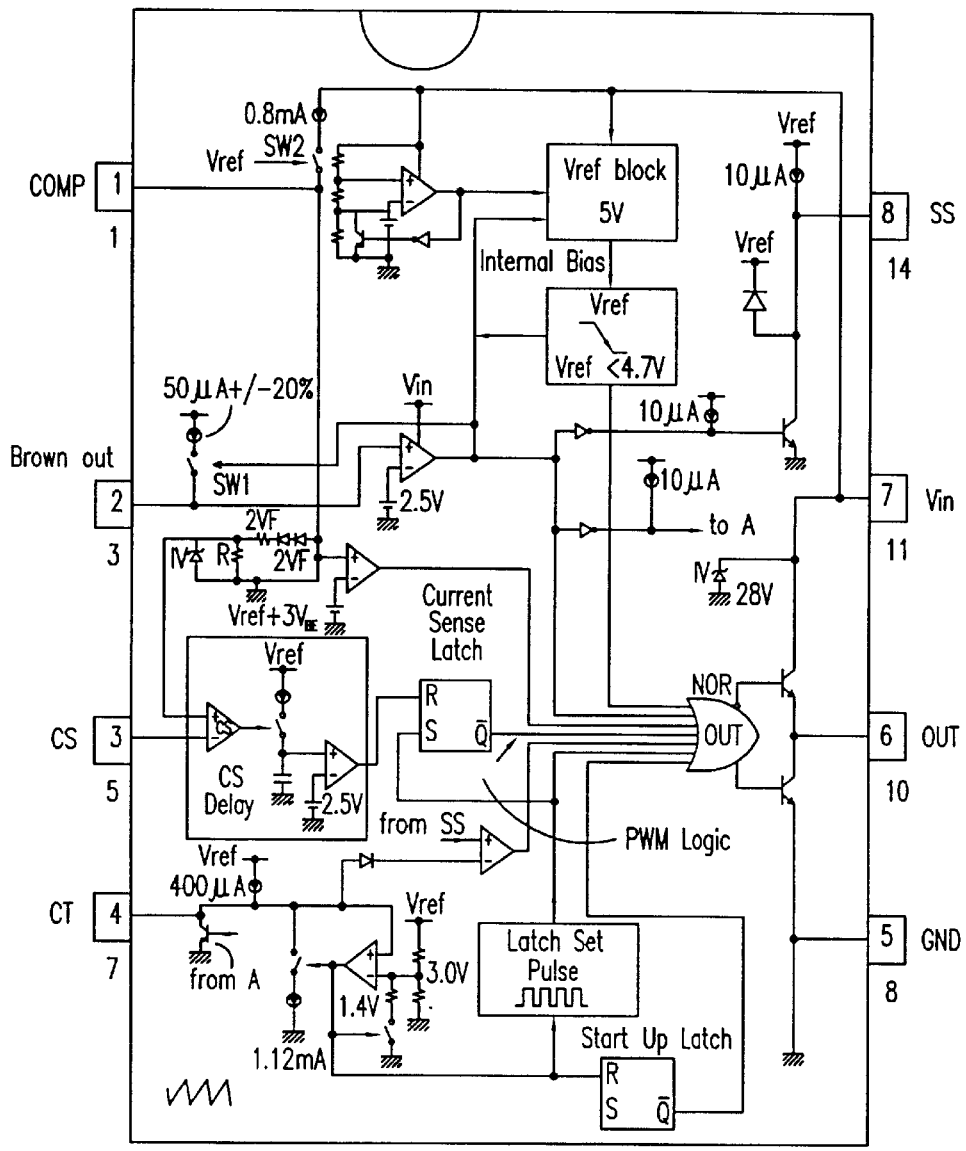
FIG. 1 schematically shows the pin assignment and the internal control circuits of a PWM IC according to an embodiment of the present invention.

The PWM IC of the present invention is packaged based on 8-pin DIP or 14-pin SOP IC package technique, and is designed with the spirit of preserving the complete voltage regulation function. Referring to FIG. 1, the pin assignment and the internal control circuits of a PWM IC according to an embodiment of the present invention are shown. The circuit architecture and operating theorem of the PWM IC of the present invention can be best understood through the following descriptions, and can be realized by one skilled in the art by virtue of the teachings herein. It is to be understood that the implementation of the present invention can not be limited by the following embodiment to be the exhaustive form.

In FIG. 1, the five pins in relation with the PWM IC of the present invention and the pin functions thereof will be illustrated in detail. As can be seen from FIG. 1, the pin number of the PWM IC packaged as an 8-pin DIP IC is shown as the numbers encircled in the square blocks, while the pin number of the PWM IC packaged as a 14-pin SOP IC is shown as the numbers underneath the square blocks. The pin functions corresponding to each pin of the PWM IC will be discussed with reference to the circuit topologies of FIGS. 2 to 6. In this embodiment, the 8-pin DIP PWM IC will be taken as an example to illustrate the respective pin functions of the PWM IC, and the other pins are of no interest to the present invention, and we are not intended to have a discussion herein.

Figure 2:
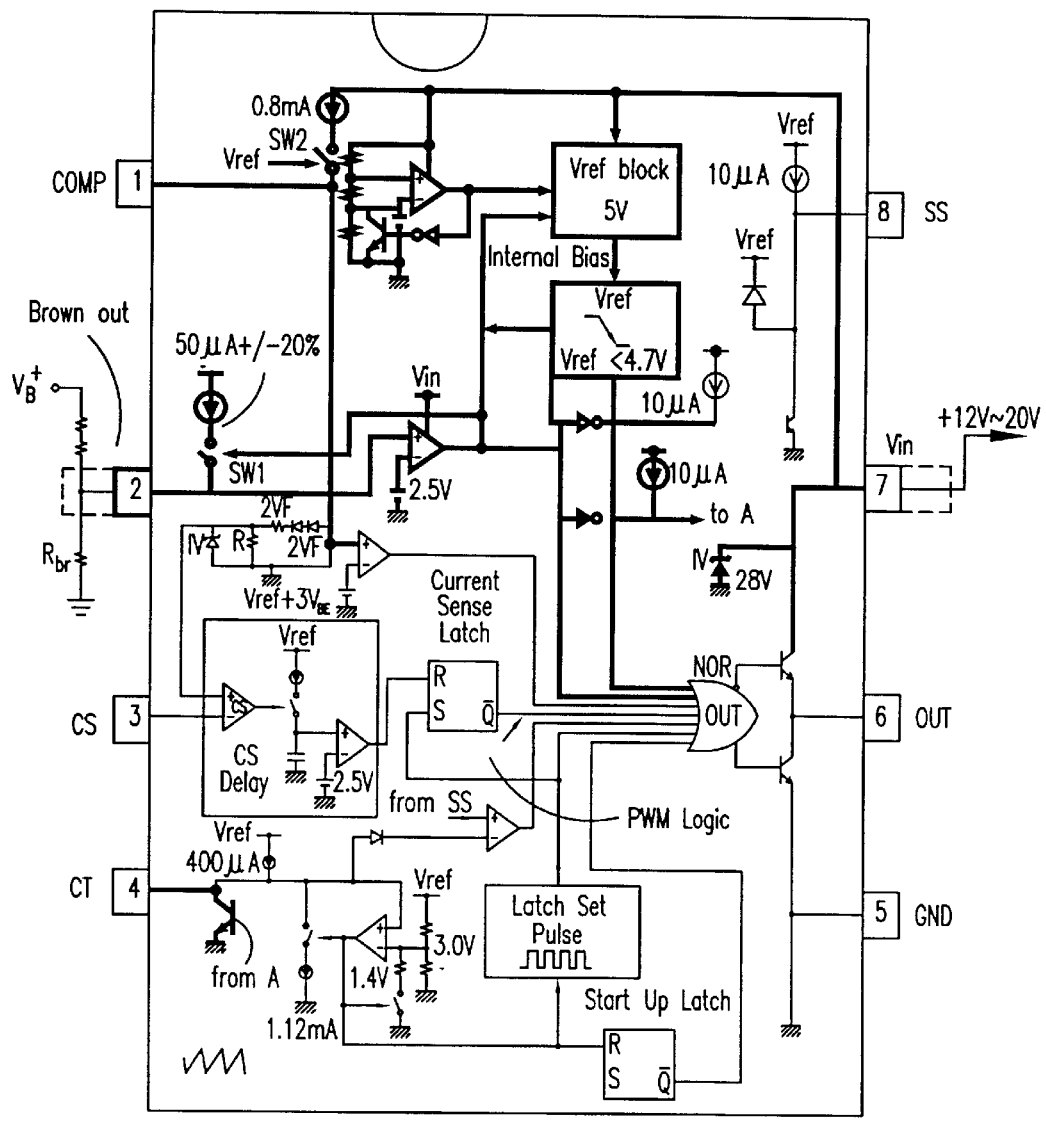
FIGS. 2 to 6 respectively illustrates each pin function of PWM IC and the internal control circuits associated therewith according to an embodiment of the present invention.

1. $V_{in}$ pin and Brown Out pin: The seventh pin $V_{in}$ of the PWM IC of the present invention is assigned to input power to provide the internal bias and working power for the PWM IC. Referring to FIG. 2, because the startup current of a common PWM IC is quite high, conventional PWM IC generally needs to externally connect with a power control circuit to cut off its startup current in order to save power consumption.

The PWM IC of the present invention substantially integrates the power control circuit therein. When the PWM IC is not in use any longer, the power control circuit can drive the PWM IC into standby mode to save power consumption. As described above, when the switching mode power supply stays at standby mode, the PWM IC of the main power supply is shut down and no power is outputted. At this moment the switching mode power supply still has standby power for output. For the purpose of saving power consumption, in a normal PWM IC design process an additional power control circuit is needed to turn off the startup power for the PWM IC. When the power control circuit is turned on, PWM IC is able to start up and enters into operating mode to supply power.

According to the PWM IC of the present invention, the power control circuit is built in the PWM IC, and the function of the Brown Out pin (which is assigned to the second pin of the PWM IC of the present invention) can turn off the unnecessary internal power. Moreover, the Brown Out pin can reduce the startup power to allow the switching mode power supply to save power consumption without turning off the startup power of the PWM IC in standby modem, and can simplify the circuit design and increase reliability of the power supply.

With respect to the Brown Out pin and the operation of associated internal circuit, it will be further described through the following.

The Brown Out pin principally functions as a switch control for the internal voltage source of the PWM IC. The voltage potential of the Brown Out pin is derived through filtering the commercially available power source and dividing the filtered power by a voltage divider. When the voltage potential of the Brown Out pin is transmitted to the interior of the PWM IC, it will be compared with the reference voltage provided by the internal circuit and a control signal will be emitted to the internal power control circuit in the PWM IC in response to the comparison result to control the switch of the PWM IC. Brown Out pin is the only one that can sustain supplying power normally when the internal power of the PWM IC is turned off. Brown Out pin also can be used to sense the voltage potential of external voltage to control the timing for starting up and shutting down the PWM IC and constrain the PWM IC to work within normal input AC voltage. When the input AC voltage is sensed below a normal range, the internal power control circuit may be turned off to interrupt the power supply so as to prevent the electronic components from damage due to an excessive voltage stress. Also it may use photo coupler to couple the remote on/off signals at the secondary side of the transformer to regulate the voltage of the Brown Out pin.

When the sensed voltage is higher than or equal to the internal reference voltage of the PWM IC, the internal power control circuit of the PWM IC will turn on and start up the PWM IC. The PWM IC will establish a 5-V reference voltage internally and start up the internal constant current source to provide the power needed by the internal control circuits. When the internal control circuits reach a normal working voltage, the PWM IC is started up to drive the voltage switches to output voltage.

When the internal current source is started up, a constant current will be outputted through the Brown Out pin. This constant current will set an additional voltage through the ground resistance $R_{br}$ and impose the additional voltage on the sensed external voltage to ensure the normal turn-on operation of the power supply.

It should be noted that Brown Out pin is capable of configuring the PWM IC to start up at a high AC linear voltage and shut down at a low AC linear voltage. Hence the Brown Out pin is provided with function of setting hysteresis voltage to ensure the normal turn-on operation of the power supply.

Figure 3:
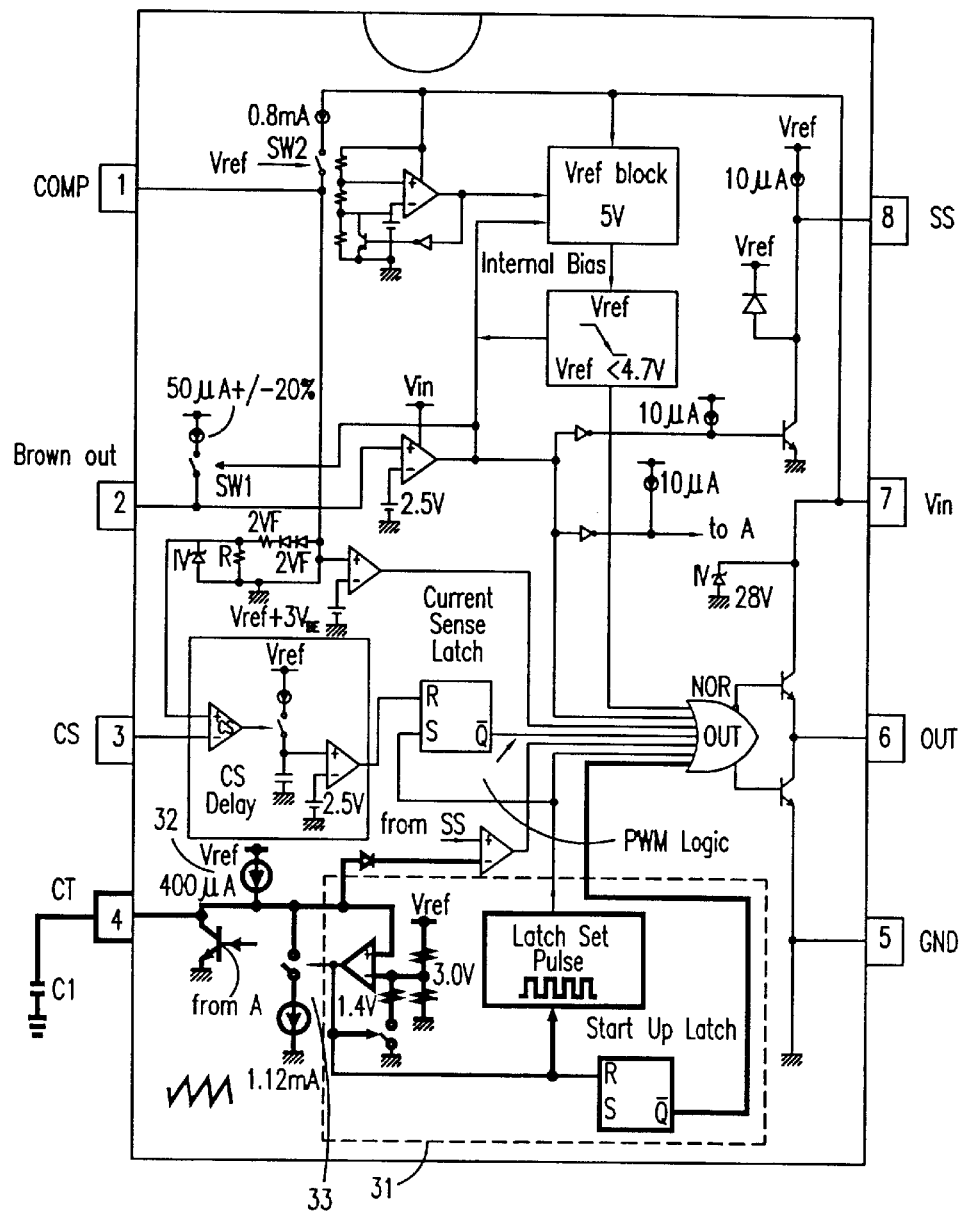

2. CT pin: The CT pin is set at the fourth pin of the PWM IC of the present invention. The internal circuit in relation with the CT pin includes an internal oscillating circuit 31 together with two constant current sources 32 and 33. As shown in FIG. 3, the operation frequency of the PWM IC of the present invention is determined by means of the capacitance of a capacitor $C_1$ externally connected between the CT pin and a ground terminal. In addition, the maximum pulse width ratio as driving the voltage switches has been preset by the ratio of the current values of the two constant current sources 32 and 33. Because the operation frequency of the PWM IC is controlled by a single capacitor $C_1$, the internal control circuit of the PWM IC is integrated with a constant current source for charging the capacitor $C_1$ and a constant current source for discharging the capacitor $C_1$. When the PWM IC starts up, the constant current source preset for charging the capacitor will be activated to charge the capacitor $C_1$, while the constant current source preset for discharging the capacitor will be turned off. The voltage potential of the capacitor $C_1$ will go up linearly. When the internal oscillating circuit 31 detects that the voltage potential of the capacitor $C_1$ has reached and exceeded a predetermined reference voltage, the constant current source preset for discharging the capacitor will be turned on and drive the capacitor $C_1$ to discharge. The reference voltage will be regulated to a low voltage level to keep the capacitor on discharging. When the voltage potential of the capacitor $C_1$ is discharged as lower than the internal reference voltage, the discharge loop is open-circuited and the internal reference voltage is forced to go up to a high voltage level. The constant current source preset for charging the capacitor $C_1$ will be forced to charge the capacitor $C_1$ again. The charge/discharge operations will circulate and establish a charge/discharge cycle, and the internal control circuits will drive the output pins of the PWM IC to output synchronous pulse signal to drive the other electronic elements, so as to accomplish the fundamental operation of the switching mode power supply.

Figure 4:
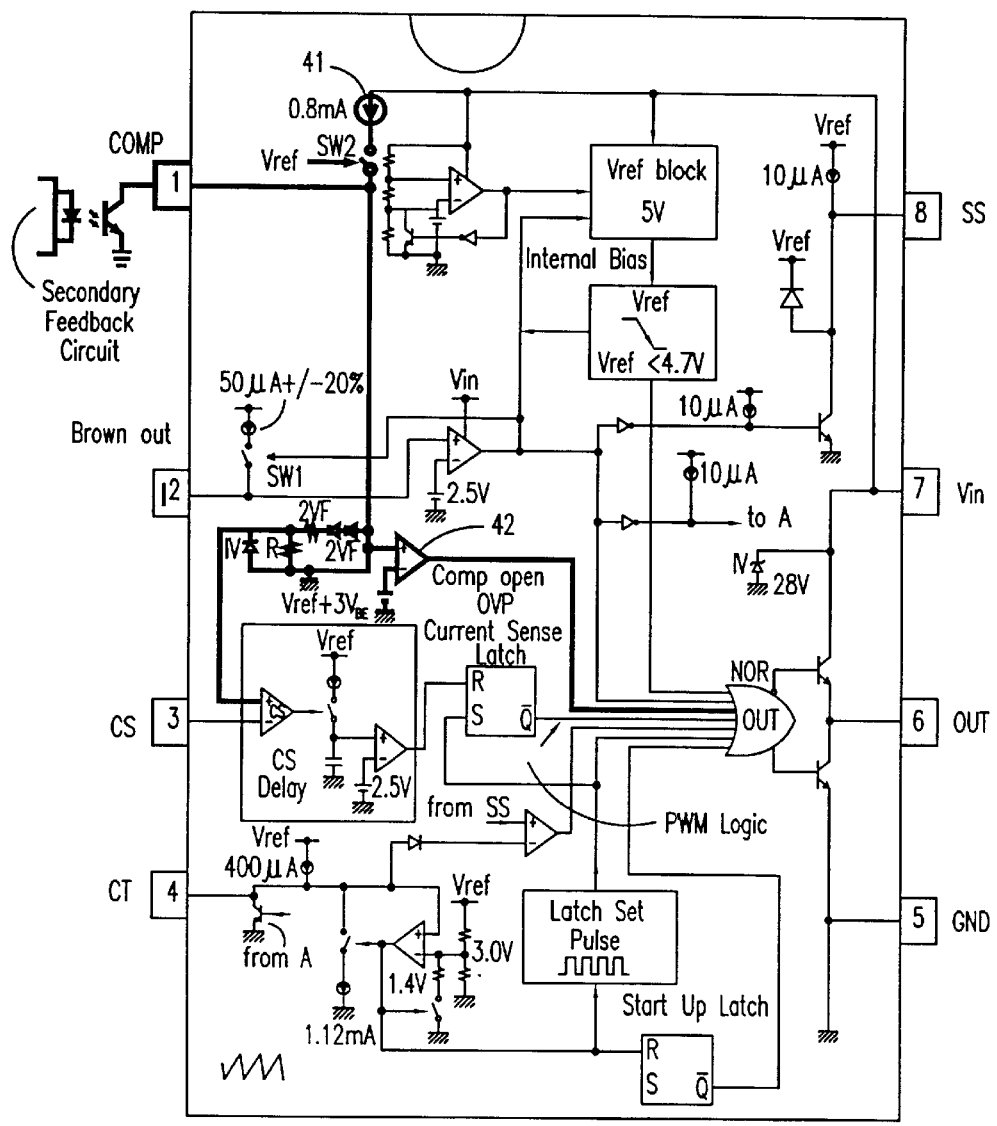

3. COMP pin: The first pin of the PWM IC of the present invention functions as a feedback voltage input terminal, as well as a built in pin-opened control circuit provided with overvoltage protection function. Referring to FIG. 4, the internal control circuit in relation with the COMP pin includes a constant current source 41 and a comparator 42. When the PWM IC starts up, the constant current source 41 is turned on and couples to the reference current input terminal of the current amplifier of the CS pin, and outputs current through the COMP pin. The comparator 42 is used to detect whether the COMP pin is open-circuited or suffers from an excessive voltage. When the COMP pin is open-circuited abnormally, the constant current source 41 can not output current and the internal control circuit is provided with high impedance characteristic. As a result, the voltage potential of COMP pin will go up rapidly. When the voltage potential of COMP pin reaches a predetermined level, the comparator 42 sends out a signal to interrupt the driving output so as to prevent the output voltage of the power supply from getting out of control. When the reason for abnormal open-circuit on the COMP pin is eliminated, the voltage potential of COMP pin will automatically restore. When the voltage potential of COMP pin goes up due to external forces, this internal circuit also can provide the overvoltage protection function for the COMP pin.

Figure 5:
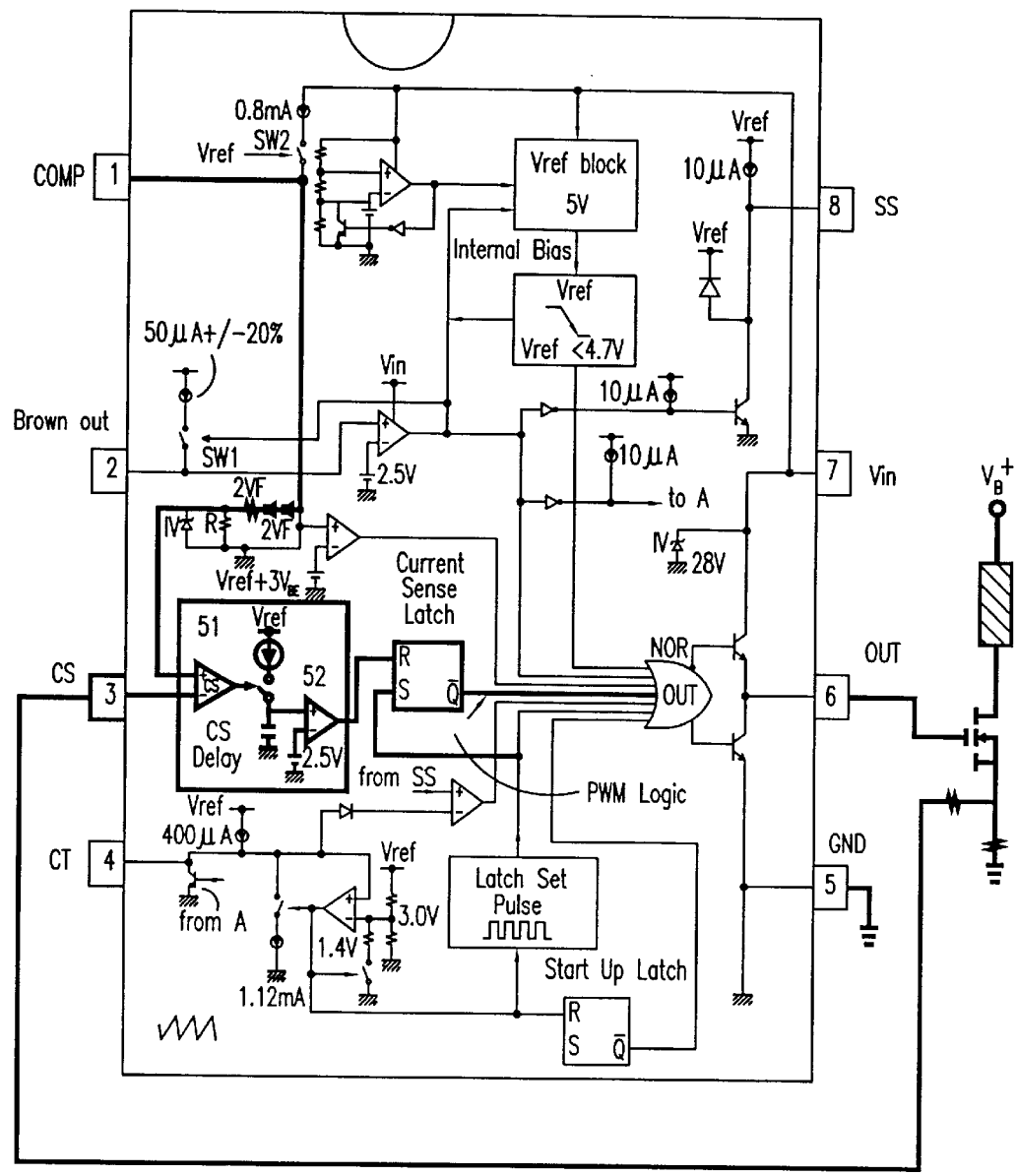

4. CS pin: The third pin of the PWM IC of the present invention is assigned to be an input pin for current feedback and current sense signal. Referring to FIG. 5, the internal circuit in relation with the CS pin includes a current amplifier 51 and a delay amplifier 52. The current amplifier 51 is used to couple the input signal of the COMP pin and the current signal of the CS pin in order to regulate the drive output pulse width coercively. It can be used to regulate the output voltage of the switching mode power supply and further stabilize the output voltage of the power supply.

When the input current signal of the CS pin approaches the internal reference current value, it indicates that the input current of the CS pin has been saturated, and the drive output pulse width will be limited. When the input current signal of the CS pin has reached or exceeded the internal reference current value, the drive output pulse width will be reduced coercively to limit the output power of the switching mode power supply, and further the output voltage and the output power of the power supply are reduced.

As regards the function of the delay amplifier 52, because the current signal is a pulse signal, its front edge will cause a noise signal due to the inductive characteristic of the transformer. This considerably high front edge signal is greater than the internal reference signal and will result in interference. The delay amplifier 52 is used to delay the current signal to disallow abnormal current signal to enter into the internal control circuit to cause interference.

Figure 6:
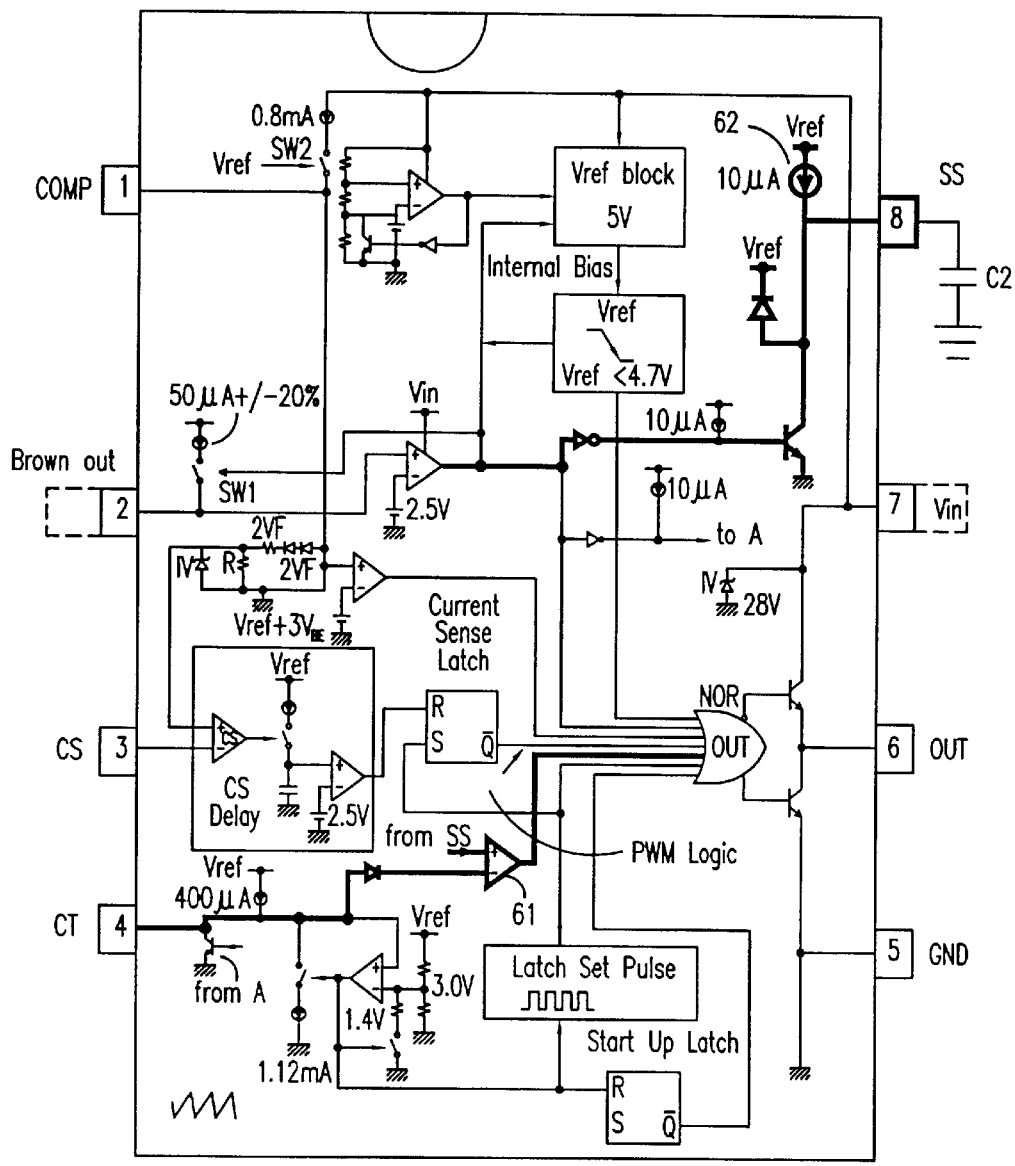

5. SS pin: the eighth pin of the PWM. IC of the present invention is assigned to perform the soft-start operation for the switching mode power supply. Referring to FIG. 6, the function of the SS pin is used to set the soft-start period of the switching mode power supply. That is, when the power supply starts up, the SS pin is used to limit the pulse width and coercively drive the output pulse width to increase tardily from minimum, and control the output voltage of the power supply to go up tardily as the power supply starts up to avoid the instantaneous output voltage from going over-high and avoid the generation of excessive voltage stress on the power elements due to the excessive reverse voltage. The internal circuit in relation with the SS pin is comprised of a voltage comparator 61, a built-in constant current source 62 as well as a capacitor $C_2$ located between the SS pin and a ground terminal. The reference voltage input terminal of the voltage comparator receives a sawtooth wave through the CT pin, and the constant current source 62 will be turned on to output current when the Brown Out pin starts up the internal circuit. In the mean time, the discharge loop for the capacitor $C_2$ will be open-circuited to enable the constant current source 62 to charge the capacitor $C_2$ and establish the voltage of the SS pin.

The voltage of the SS pin will be fed to another signal input terminal and compared with the voltage of the CT pin. When the voltage of CT pin is higher than the voltage of SS pin, the drive output pulse will be interrupted to reduce the pulse width of the output pulse signal.

In conclusion with the above discussions, it can be known that the PWM IC of the present invention is peculiarized by:

1. Power-saving mode supported: The PWM IC of the present invention creates a Brown Out pin and associated internal control circuit combined therewith. The Brown Out pin can compare the sensed external voltage with a reference voltage to control the on/off states of the switch of the internal power control circuit, so as to achieve the power-saving function.
2. Create most of the pin functions with internal current source: conventional PWM IC uses external voltage sources to create and define pin functions for each pin. The present invention employs internal current sources to creates most of the pin functions and accomplish the functions of the internal control circuits of the PWM IC. In this manner the complexity of circuit design is significantly lowered and the output pulse signal is stabilized.

While the present invention has been described in terms of what are presently considered to be the most practical and preferred embodiments, it is to be understood that the present invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A pulse width modulation integrated circuit comprising:

a first control circuit for sensing an external voltage and comparing a sensed external voltage with a reference voltage, and in response thereto control the on/off state of an internal power control circuit;

a second control circuit including a first capacitor coupled in series between a corresponding pin and a ground terminal, and a first current source and a second current source for alternatively charging and discharging said first capacitor to regulate an operation frequency of said pulse width modulation integrated circuit;

a third control circuit including a third current source and a first comparator for receiving an external voltage feedback signal and detecting whether a corresponding pin is open-circuited, and generating a control signal to regulate a pulse width of an output pulse signal of said pulse width modulation integrated circuit when said corresponding pin is open-circuited;

a fourth control circuit including a current amplifier and a delay amplifier for sensing an external current signal and transforming a sensed external current signal into a pulse width modulation signal to regulate a pulse width of an output pulse signal of said pulse width modulation integrated circuit; and a fifth control signal including a second comparator and a fourth current source for increasing a pulse width of an output pulse signal of said pulse width modulation integrated circuit tardily when said pulse width modulation integrated circuit starts up.

2. The pulse width modulation integrated circuit as recited in claim 1 wherein said pulse width modulation integrated circuit is provided with 8 pins and packaged in a dual-in-line package form.

3. The pulse width modulation integrated circuit as recited in claim 1 wherein said pulse width modulation integrated circuit is provided with 14 pins and packaged in a small-outline package form.

* * * * *